US012685114B2

(12) United States Patent
Zhang et al.

(10) Patent No.: US 12,685,114 B2
(45) Date of Patent: Jul. 14, 2026

(54) CONTACT PAD STRUCTURE AND MANUFACTURING METHOD THEREOF

(71) Applicant: Fujian Jinhua Integrated Circuit Co., Ltd., Quanzhou City (CN)

(72) Inventors: Janbo Zhang, Quanzhou City (CN); Li-Wei Feng, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 506 days.

(21) Appl. No.: 18/201,200

(22) Filed: May 24, 2023

(65) Prior Publication Data

US 2024/0363401 A1 Oct. 31, 2024

(30) Foreign Application Priority Data

Apr. 27, 2023 (CN) .......................... 202310473062.3
Apr. 27, 2023 (CN) .......................... 202320999110.8

(51) Int. Cl.
*H10W 20/00* (2026.01)
*H10W 20/43* (2026.01)

(52) U.S. Cl.
CPC ....... *H10W 20/076* (2026.01); *H10W 20/056* (2026.01); *H10W 20/081* (2026.01); *H10W 20/43* (2026.01)

(58) Field of Classification Search
CPC . H10W 20/076; H10W 20/43; H10W 20/056; H10W 20/46; H10W 20/072; H10D 62/115
See application file for complete search history.

(56) References Cited

U.S. PATENT DOCUMENTS

| | | | | |
|---|---|---|---|---|
| 6,136,687 | A * | 10/2000 | Lee ...................... | H01L 21/7682 |
| | | | | 438/669 |
| 6,387,791 | B1 * | 5/2002 | McIntyre ............ | B81C 1/00071 |
| | | | | 257/E21.585 |
| 7,078,313 | B2 * | 7/2006 | Kirchhoff ......... | H01L 21/76897 |
| | | | | 257/E21.507 |
| 9,018,108 | B2 | 4/2015 | Hong | |
| 2004/0097065 | A1 * | 5/2004 | Lur ..................... | H01L 21/7682 |
| | | | | 438/619 |
| 2007/0264819 | A1 * | 11/2007 | Offenberg ........... | H01L 23/5329 |
| | | | | 438/622 |
| 2011/0006390 | A1 | 1/2011 | Huang | |
| 2012/0261789 | A1 * | 10/2012 | Graham ............ | H01L 21/76232 |
| | | | | 257/E21.546 |
| 2017/0140979 | A1 * | 5/2017 | Lin ................... | H01L 21/76832 |
| 2018/0044790 | A1 | 2/2018 | Van Cleemput | |

* cited by examiner

*Primary Examiner* — John M Parker
(74) *Attorney, Agent, or Firm* — Winston Hsu

(57) ABSTRACT

A contact pad structure and a manufacturing method thereof are disclosed in the present invention. The contact pad structure includes a substrate, a first dielectric layer, a second dielectric layer, first contact pads, an etching stop layer, a first void, and a second void. The first contact pads are disposed on a first region of the substrate. The first dielectric layer is disposed on the substrate, covers the first contact pads, and includes a recess located between two adjacent first contact pads. The etching stop layer is disposed on the first dielectric layer and partially located in the recess. The second dielectric layer is disposed on the etching stop layer and partially located in the recess. The first void is disposed in the etching stop layer and located in the recess. The second void is disposed in the second dielectric layer and located in the recess.

20 Claims, 6 Drawing Sheets

CONTACT PAD STRUCTURE AND MANUFACTURING METHOD THEREOF

BACKGROUND OF THE INVENTION

1. Field of the Invention

The present invention relates to a contact pad structure and a manufacturing method thereof, and more particularly, to a contact pad structure including a void disposed between contact pads and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Therefore, the distance between components and/or between circuits becomes smaller and smaller, and the problem of mutual interference becomes more serious.

SUMMARY OF THE INVENTION

A contact pad structure and a manufacturing method thereof are provided in the present invention. Voids are disposed in material layers located between contact pads for reducing the parasitic capacitance between the contact pads adjacent to each other and improving the interference problem between the contact pads accordingly.

According to an embodiment of the present invention, a contact pad structure is provided. The contact pad structure includes a substrate, a first dielectric layer, a second dielectric layer, an etching stop layer, first contact pads, a first void, and a second void. The first contact pads are disposed on a first region of the substrate. The first dielectric layer is disposed on the substrate and covers the first contact pads, and the first dielectric layer includes a recess located between two of the first contact pads adjacent to each other. The etching stop layer is disposed on the first dielectric layer and partially located in the recess, and the second dielectric layer is disposed on the etching stop layer and partially located in the recess. The first void is disposed in the etching stop layer and located in the recess, and the second void is disposed in the second dielectric layer and located in the recess.

According to an embodiment of the present invention, a manufacturing method of a contact pad structure is provided. The manufacturing method includes the following steps. First contact pads are formed on a first region of a substrate. A first dielectric layer is formed on the substrate, the first dielectric layer covers the first contact pads, and the first dielectric layer includes a recess located between two of the first contact pads adjacent to each other. An etching stop layer is formed on the first dielectric layer, the etching stop layer is partially located in the recess, and a first void is formed in the etching stop layer and located in the recess. A second dielectric layer is formed on the etching stop layer, the second dielectric layer is partially located in the recess, and a second void is formed in the second dielectric layer and located in the recess.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIGS. 1-6 are schematic drawings illustrating a manufacturing method of a contact pad structure according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

DETAILED DESCRIPTION

To provide a better understanding of the presented invention, preferred embodiments will be described in detail. The preferred embodiments of the present invention are illustrated in the accompanying drawings with numbered elements. In addition, the technical features in different embodiments described in the following may be replaced, recombined, or mixed with one another to constitute another embodiment without departing from the spirit of the present invention.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 6:
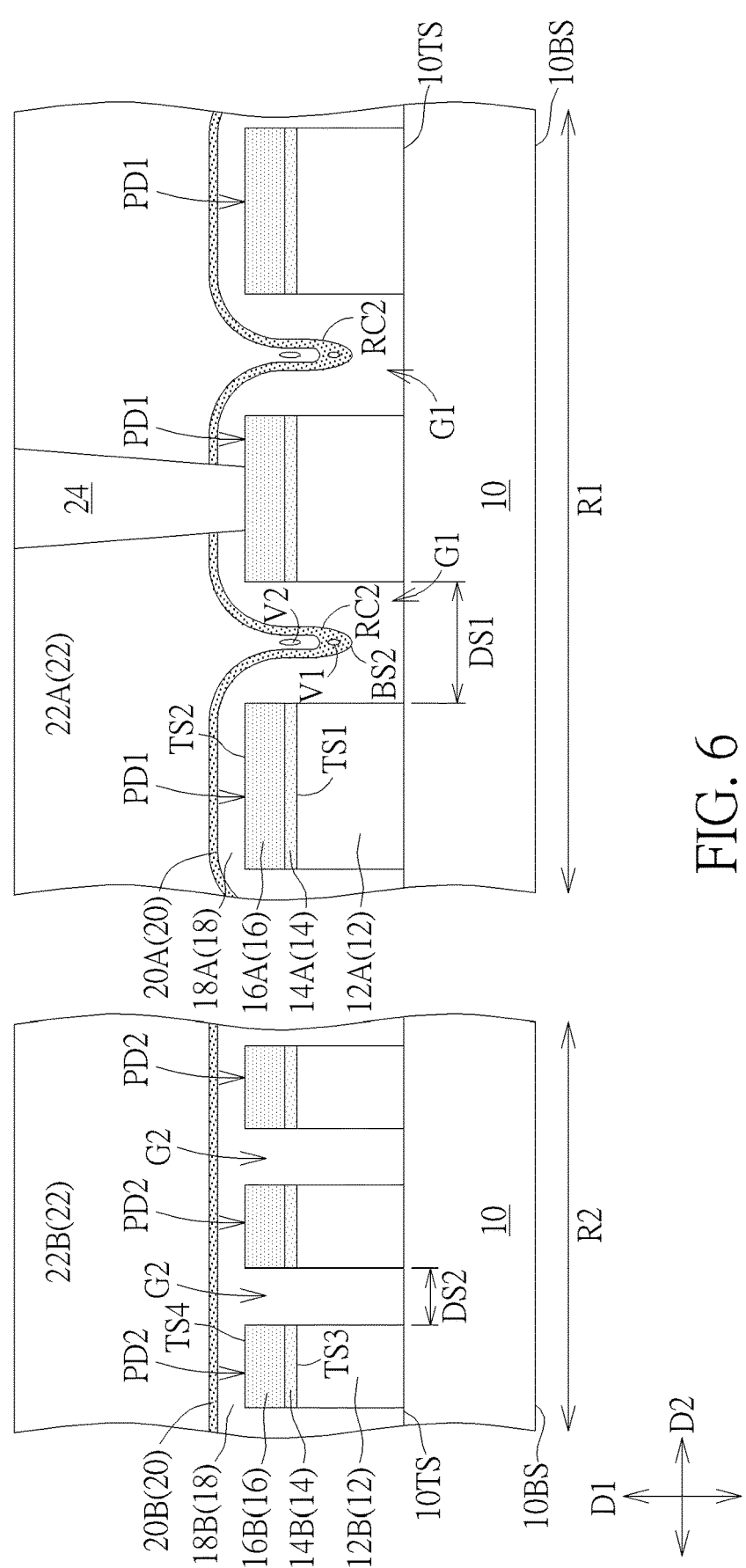

Please refer to FIG. 6. FIG. 6 is a schematic drawing illustrating a contact pad structure according to an embodiment of the present invention. As shown in FIG. 6, the contact pad structure in this embodiment includes a substrate 10, a first dielectric layer 18, a second dielectric layer 22, an etching stop layer 20, at least two first contact pads PD1, a first void V1, and a second void V2. The substrate 10 may include a first region R1 and a second region R2, and the first contact pads PD1 are disposed on the first region R1 of the substrate 10. The first dielectric layer 18 is disposed on the substrate 10 and covers the first contact pads PD1, and the first dielectric layer 18 includes a recess RC2 located between two of the first contact pads PD1 adjacent to each other. The etching stop layer 20 is disposed on the first dielectric layer 18 and partially located in the recess RC2, and the first void V1 is disposed in the etching stop layer 20 and located in the recess RC2. The second dielectric layer 22 is disposed on the etching stop layer 20 and partially located in the recess RC2, and the second void V2 is disposed in the second dielectric layer 22 and located in the recess RC2. The parasitic capacitance between the first contact pads PD1 adjacent to one another may be reducing by forming voids in the material layers located between the first contact pads PD1 adjacent to one another, and the interference problem between the first contact pads PD1 (such as a signal interference issue, but not limited thereto) may be improved accordingly.

In some embodiments, the substrate 10 may include a single layer or multiple layers of materials, such as a dielectric layer, a substrate, or a substrate and a dielectric layer disposed on this substrate, but not limited thereto. The dielectric layer described above may include an oxide dielectric material (such as silicon oxide, but not limited thereto), a nitride dielectric material (such as silicon nitride, but not limited thereto), an oxynitride dielectric material (such as silicon oxynitride, but not limited thereto), a carbonitride dielectric material (such as silicon carbonitride, but not limited thereto), or other suitable dielectric materials, and the substrate described above may include a semiconductor substrate, such as a silicon substrate, a silicon germanium semiconductor substrate, a silicon-on-insulator (SOI) substrate, or a substrate made of other suitable materials, but not limited thereto. In addition, active components, passive components, and/or other circuits (not illustrated) may be formed on the substrate described above, and the first contact pad PD1 may be electrically connected with the components and/or the circuits on the substrate via other conductive lines, but not limited thereto. In some embodiments, the first contact pad PD1 may be disposed in the peripheral region of an integrated circuit structure, and the first contact pad PD1 may be regarded as a peripheral contact pad accordingly, but not limited thereto.

In some embodiments, the first contact pads, the first dielectric layer 18, the etching stop layer 20, and the second dielectric layer 22 may be disposed on a top surface 10TS of the substrate 10, and the top surface 10TS and a bottom surface 10BS of the substrate 10 may be two opposite surfaces of the substrate 10 in a vertical direction D1, and the vertical direction D1 may be regarded as a thickness direction of the substrate 10 accordingly, but not limited thereto. In this description, a distance between the top surface 10TS of the substrate 10 and a relatively higher location and/or a relatively higher part in the vertical direction D1 may be greater than a distance between the top surface 10TS of the substrate 10 and a relatively lower location and/or a relatively lower part in the vertical direction D1. The bottom or a lower portion of each component may be closer to the top surface 10TS of the substrate 10 in the vertical direction D1 than the top or upper portion of this component. Another component disposed above a specific component may be regarded as being relatively far from the top surface 10TS of the substrate 10 in the vertical direction D1, and another component disposed under a specific component may be regarded as being relatively close to the top surface 10TS of the substrate 10 in the vertical direction D1. Additionally, in this description a top surface of a specific component may include the topmost surface of this component in the vertical direction D1, and a bottom surface of a specific component may include the bottommost surface of this component in the vertical direction D1, but not limited thereto.

In some embodiments, the contact pad structure may include two or more first contact pads PD1 disposed on the substrate 10, and the first contact pads PD1 may be arranged in a horizontal direction D2 substantially orthogonal to the vertical direction D1 and separated from one another. The structures and dimensions of the first contact pads may be substantially identical to one another, and the first contact pads PD1 may be aligned with substantially equal intervals in the horizontal direction D2, but not limited thereto. In some embodiments, each of the first contact pads PD1 may include multiple material layers. For example, each of the first contact pads PD1 may include a dielectric pattern 12A, a barrier pattern 14A, and an electrically conductive pattern 16A disposed and stacked in the vertical direction D1, but not limited thereto. In each of the first contact pads PD1, the electrically conductive pattern 16A may be disposed above the dielectric pattern 12A in the vertical direction D1, and the barrier pattern 14A may be sandwiched between the dielectric pattern 12A and the electrically conductive pattern 16A in the vertical direction D1 and directly contacting the dielectric pattern 12A and the electrically conductive pattern 16A. The dielectric pattern 12A, the barrier pattern 14A, and the electrically conductive pattern 16A may be disposed corresponding to one another in the vertical direction D1 and have substantially the same projection pattern and/or the same projection area in the vertical direction D1, but not limited thereto. In some embodiments, the dielectric pattern 12A may include an oxide dielectric material, a nitride dielectric material, or other suitable dielectric materials, and a material composition of the dielectric pattern 12A may be different from a material composition of the substrate 10 for avoiding damage to the substrate 10 during the process of forming the first contact pads PD1, but not limited thereto. The barrier pattern 14A may include titanium nitride, tantalum nitride, or other suitable electrically conductive barrier materials, and the electrically conductive pattern 16A may include copper, aluminum, tungsten, molybdenum, an alloy of the above-mentioned materials, a composite layer structure of the above-mentioned materials, or other suitable electrically conductive materials.

The first dielectric layer 18 may include an oxide dielectric material or other suitable dielectric materials, and the first dielectric layer 18 may include the recess RC2. The recess RC2 may be located in a gap G1 between two of the first contact pads PD1 adjacent to each other, and the gap G1 is not fully filled with the first dielectric layer 18. In some embodiments, the first dielectric layer 18 may cover a top surface of each of the first contact pads PD1, a sidewall of each of the first contact pads PD1, and the top surface 10TS of the substrate 10, and the first dielectric layer 18 covering the top surface 10TS of the substrate 10 may have the lowest surface (such as the lowest top surface) relative to other portions of the first dielectric layer 18. In addition, the etching stop layer 20 may include a nitride dielectric material or other suitable dielectric materials, the second dielectric layer 22 may include an oxide dielectric material or other suitable dielectric materials, and a material composition of the etching stop layer 20 may be different from a material composition of the first dielectric layer 18 and a material composition of the second dielectric layer 22. In some embodiments, the etching stop layer 20 may be disposed conformally of the top surface of the first dielectric layer 18 and directly contact the top surface of the first dielectric layer 18. Therefore, a portion of the etching stop layer 20 may be disposed in the recess RC2 of the first dielectric layer 18, and the recess RC2 is not fully filled with the etching stop layer 20. The second dielectric layer 22 may be disposed on the top surface of the etching stop layer 20 and directly contact the top surface of the etching stop layer 20, and a portion of the second dielectric layer 22 may be disposed in the recess RC2 of the first dielectric layer 18. By controlling the condition of the recess RC2, such as controlling the depth of the recess RC2 in the vertical direction D1, the aspect ratio of the recess RC2, or other structural features of the recess RC2, the first void V1 may tend to be formed in the etching stop layer 20 during the step of forming the etching stop layer 20, and the first void V1 may tend to be formed in the etching stop layer 20 located within the recess RC2. In addition, the second void V2 may tend to be formed in the second dielectric layer 22 located within the recess RC2 during the step of forming the second dielectric layer 22 on the etching stop layer 20 because the recess RC2 is not fully filled with the etching stop layer 20. In some embodiments, the first void V1 and the second void V2 may respectively include an air gap or other types of void structures, and the first void V1 and the second void V2 may be separated from each other, but not limited thereto.

In some embodiments, a bottom surface BS2 of the recess RC2 may be lower than a top surface TS1 of the dielectric pattern 12A in each of the first contact pads PD1 in the vertical direction D1, and the first void V1 may be lower than the top surface TS1 of the dielectric pattern 12A in the vertical direction D1, but not limited thereto. Additionally, in some embodiments, the second void V2 may be located above the first void V1 in the vertical direction D1, and the second void V2 may be lower than a top surface TS2 of the electrically conductive pattern 16A in each of the first contact pads PD1 in the vertical direction D1, but not limited thereto. In some embodiments, the first void V1 and the second void V2 may be surrounded by the etching stop layer 20 and the second dielectric layer 22, respectively. Therefore, a portion of the first dielectric layer 18 and a portion of the etching stop layer 20 may be sandwiched between the first void V1 and one of the first contact pads PD1 (such as the dielectric pattern 12A of this first contact pad PD1) in the horizontal direction D2. A portion of the first dielectric layer 18, a portion of the etching stop layer 20, and a portion of the second dielectric layer 22 may be sandwiched between the second void V2 and one of the first contact pads PD1 (such as the dielectric pattern 12A, the barrier pattern 14A, and/or the electrically conductive pattern 16A of this first contact pad PD1) in the horizontal direction D2. In some embodiments, the first void V1 may not be completely encompassed by the etching stop layer 20 and may be directly connected with the first dielectric layer 18 and/or the second dielectric layer 22, and the second void V2 may not be completely encompassed by the second dielectric layer 22 and may be directly connected with the etching stop layer 20, but not limited thereto. In some embodiments, a contact structure 24 may penetrate through the second dielectric layer 22, the etching stop layer 20, and the first dielectric layer 18 for contacting and being electrically connected with the corresponding first contact pad PD1.

In some embodiments, the contact pad structure may further include a plurality of second contact pads PD2 disposed on the second region R2 of the substrate 10, and an interval between two of the second contact pads PD2 adjacent to each other is less than an interval between two of the first contact pads PD1 adjacent to each other. In other words, the second contact pads PD2 may be closely arranged on the substrate 10 relatively. For example, an interval DS2 between two of the second contact pads PD2 adjacent to each other in the horizontal direction D2 may be less than an interval DS1 between two of the first contact pads PD1 adjacent to each other in the horizontal direction D2. In some embodiments, the interval DS1 may be regarded as a distance between two of the first contact pads PD1 adjacent to each other in the horizontal direction D2 and/or a length of the gap G1 located between two of the first contact pads PD1 adjacent to each other in the horizontal direction D2, the interval DS2 may be regarded as a distance between two of the second contact pads PD2 adjacent to each other in the horizontal direction D2 and/or a length of a gap G2 located between two of the second contact pads PD2 adjacent to each other in the horizontal direction D2, and there is not any contact pad disposed in the gap G1 and the gap G2, but not limited thereto.

In some embodiments, each of the second contact pads PD2 may include multiple material layers. For example, each of the second contact pads PD2 may include a dielectric pattern 12B, a barrier pattern 14B, and an electrically conductive pattern 16B disposed and stacked in the vertical direction D1, but not limited thereto. In each of the second contact pads PD2, the electrically conductive pattern 16B may be disposed above the dielectric pattern 12B in the vertical direction D1, and the barrier pattern 14B may be sandwiched between the dielectric pattern 12B and the electrically conductive pattern 16B in the vertical direction D1 and directly contacting the dielectric pattern 12B and the electrically conductive pattern 16B. The dielectric pattern 12B, the barrier pattern 14B, and the electrically conductive pattern 16B may be disposed corresponding to one another in the vertical direction D1 and have substantially the same projection pattern and/or the same projection area in the vertical direction D1, but not limited thereto. Additionally, in some embodiments, the first contact pads PD1 and the second contact pads PD2 may be formed concurrently by the same process. Therefore, material compositions of the dielectric pattern 12B, the barrier pattern 14B, and the electrically conductive pattern 16B may be identical to the material compositions of the dielectric pattern 12A, the barrier pattern 14A, and the electrically conductive pattern 16A, respectively, a top surface TS3 of the dielectric pattern 12B and the top surface TS1 of the dielectric pattern 12A may be substantially located at the same level, and a top surface TS4 of the electrically conductive pattern 16B and the top surface TS2 of the electrically conductive pattern 16A may be substantially located at the same level, but not limited thereto.

In addition, the first dielectric layer 18, the etching stop layer 20, and the second dielectric layer 22 described above may further disposed partially on the second region R2 of the substrate 10, a first portion 18A and a second portion 18B of the first dielectric layer 18 may be disposed on the first region R1 and the second region R2 of the substrate 10, respectively. A first portion 20A and a second portion 20B of the etching stop layer 20 may be disposed on the first region R1 and the second region R2 of the substrate 10, respectively. A first portion 22A and a second portion 22B of the second dielectric layer 22 may be disposed on the first region R1 and the second region R2 of the substrate 10, respectively. The first dielectric layer 18 (such as the second portion 18B) may cover the second contact pads PD2, and a space between the second contact pads PD2 (such as the gap G2) may be fully filled with the first dielectric layer 18. Because the gap G2 between the adjacent second contact pads PD2 is relatively small, the gap G2 may be fully filled with the first dielectric layer 18 and the first dielectric layer 18 does not include a recess formed in the gap G2, and the second portion 20B of the etching stop layer 20 and the second portion 22B of the second dielectric layer 22 subsequently formed will not be formed in the gap G2 between the adjacent second contact pads PD2 accordingly.

Figure 1:
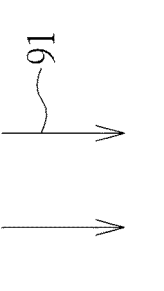
Figure 1:
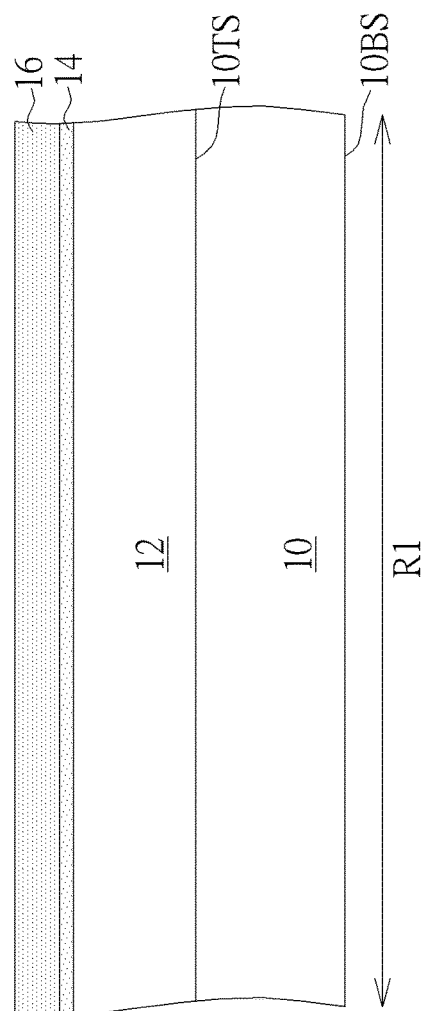
Figure 1:
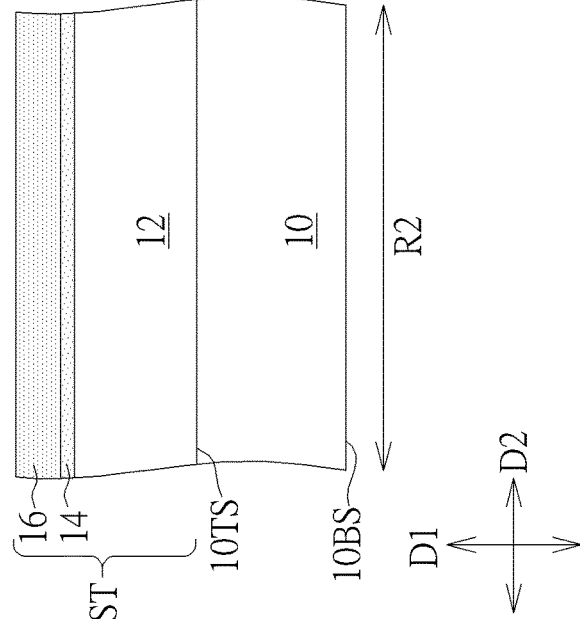
Figure 2:
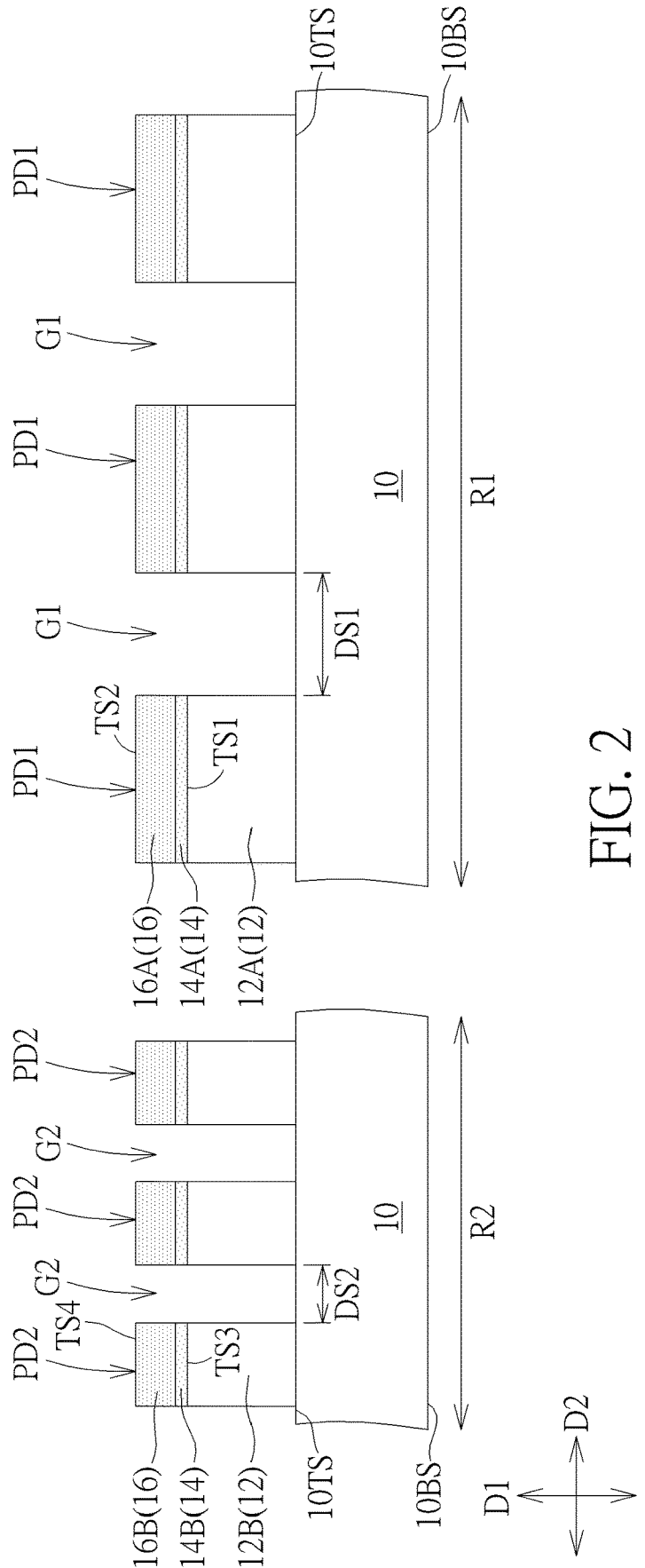
Figure 3:
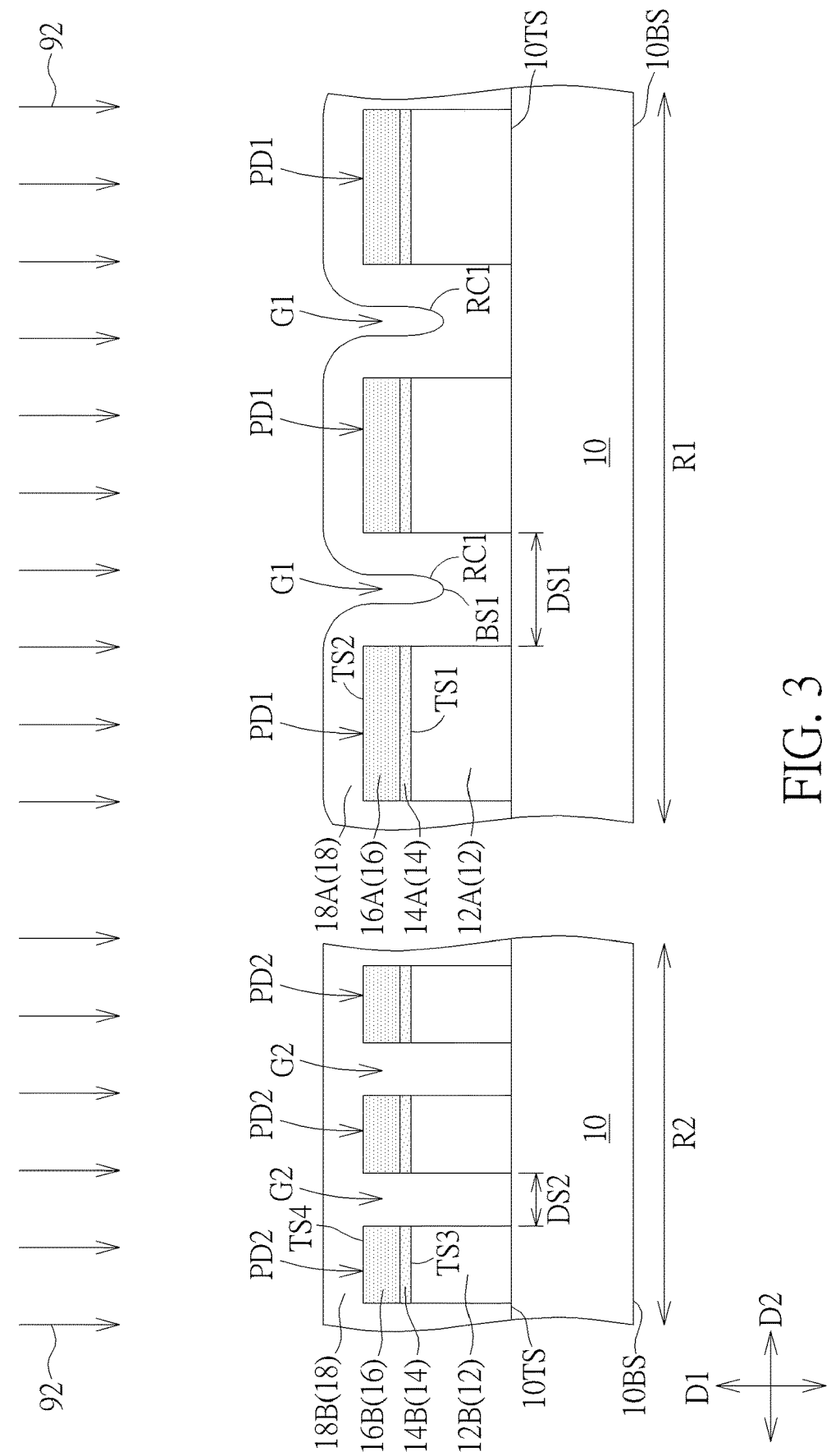
Figure 4:
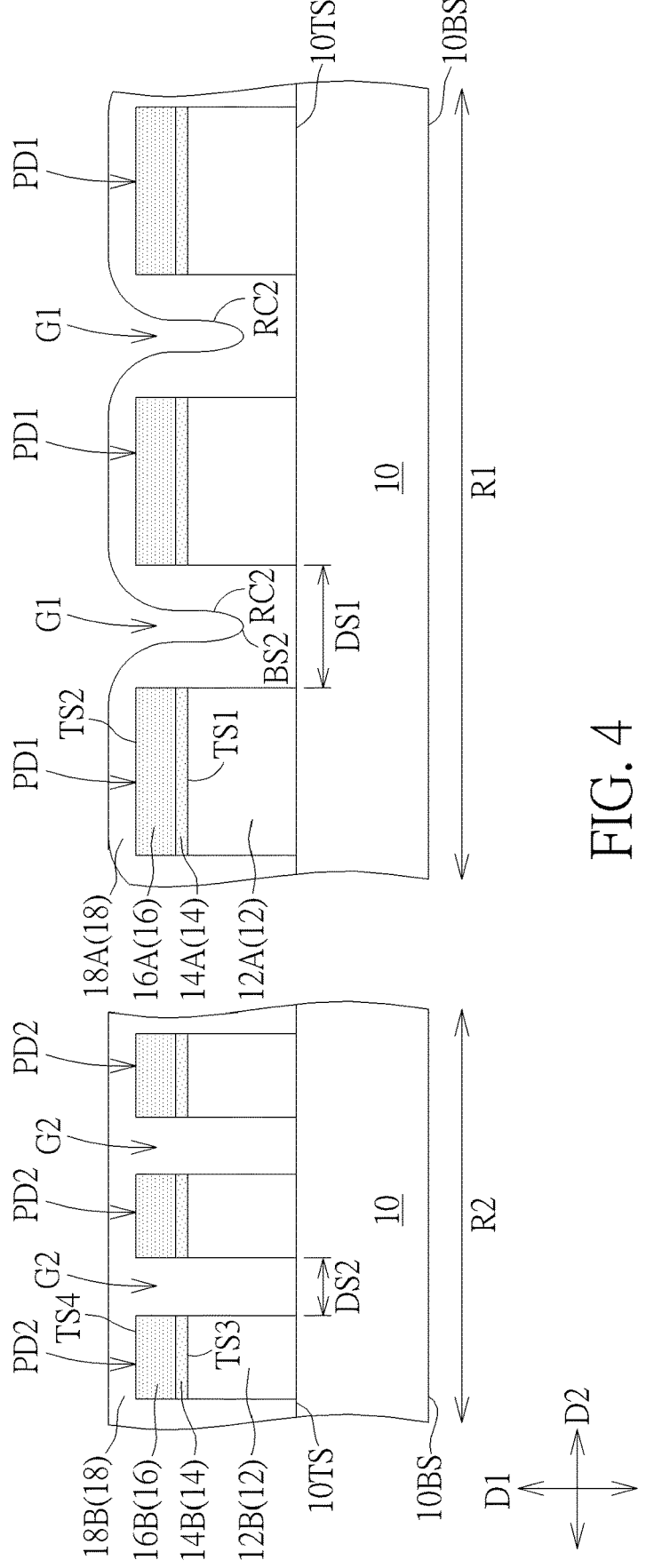
Figure 5:
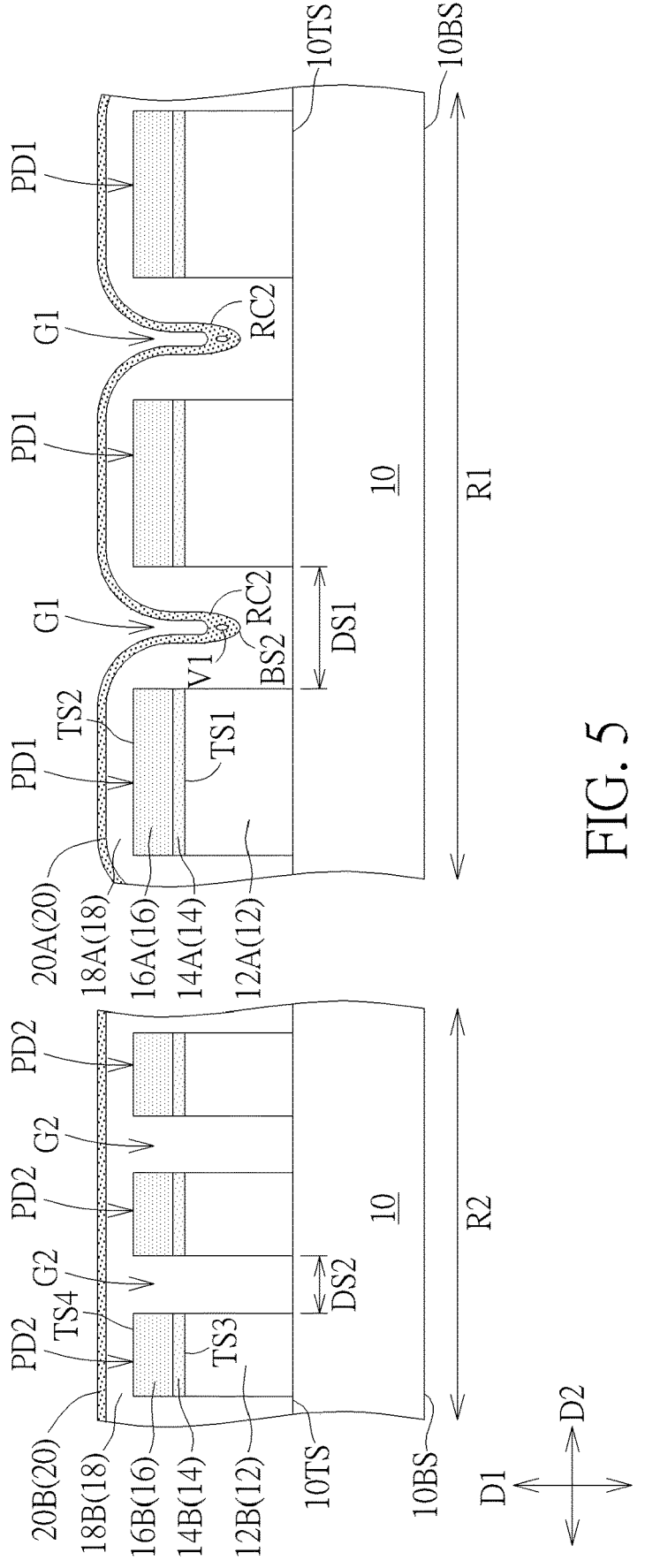

Please refer to FIGS. 1-6. FIGS. 1-6 are schematic drawings illustrating a manufacturing method of a contact pad structure according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5. As shown in FIG. 6, a manufacturing method of a contact pad structure is provided in an embodiment of the present invention, and the manufacturing method includes the following steps. At least two first contact pads PD1 are formed on the first region R1 of the substrate 10. The first dielectric layer 18 is formed on the substrate 10, the first dielectric layer 18 covers the first contact pads PD1, and the first dielectric layer 18 includes the recess RC2 located between two of the first contact pads PD1 adjacent to each other. The etching stop layer 20 is formed on the first dielectric layer 18, the etching stop layer 20 is partially located in the recess RC2, and the first void V1 is formed in the etching stop layer 20 and located in the recess RC2. The second dielectric layer 22 is formed on the etching stop layer 20, the second dielectric layer 22 is partially located in the recess RC2, and the second void V2 is formed in the second dielectric layer 22 and located in the recess RC2.

Specifically, the manufacturing method of the contact pad structure in this embodiment may include but is not limited to the following steps. As shown in FIG. 1, a laminated structure ST may be formed on the first region R1 and the second region R2 of the substrate 10, and the laminated structure ST may include a dielectric layer 12, a barrier layer 14, and an electrically conductive layer 16 disposed and stacked in the vertical direction D1. The dielectric layer 12 may include an oxide dielectric material, a nitride dielectric material, or other suitable dielectric materials, the barrier layer 14 may include titanium nitride, tantalum nitride, or other suitable electrically conductive barrier materials, and the electrically conductive layer 16 may include copper, aluminum, tungsten, molybdenum, an alloy of the above-mentioned materials, a composite layer structure of the above-mentioned materials, or other suitable electrically conductive materials. Subsequently, as shown in FIG. 1 and FIG. 2, a patterning process 91 may be performed to the laminated structure ST for forming the first contact pads PD1 and the second contact pads PD2 on the first region R1 and the second region R2 of the substrate 10, respectively. At the same time, the gap G1 may be formed between the first contact pads PD1, and the gap G2 may be formed between the second contact pads PD2. In other words, in some embodiments, the first contact pads PD1 and the second contact pads PD2 may be concurrently formed by performing the patterning process 91 to the laminated structure ST formed on the substrate 10. At least a part of the dielectric layer 12 may be patterned to become the dielectric pattern 12A and the dielectric pattern 12B by the patterning process 91, at least a part of the barrier layer 14 may be patterned to become the barrier pattern 14A and the barrier pattern 14B by the patterning process 91, and at least a part of the electrically conductive layer 16 may be patterned to become the electrically conductive pattern 16A and the electrically conductive pattern 16B by the patterning process 91, but not limited thereto.

Subsequently, as shown in FIG. 3, the first dielectric layer 18 may be formed on the substrate 10 and cover each of the first contact pads PD1 and each of the second contact pads PD2. In other words, the first dielectric layer 18 is formed after the step of forming the first contact pads PD1 and the second contact pads PD2. In some embodiments, the first contact pads PD1 may be formed on the substrate 10 without forming the second contact pads PD2 according to some design considerations. In some embodiments, because the interval between the adjacent second contact pads PD2 is relatively small and the interval between the adjacent first contact pads PD1 is relatively large, the space between the adjacent second contact pads PD2 (such as the gap G2) may be fully filled with the second portion 18B of the first dielectric layer 18 substantially, the space between the adjacent first contact pads PD1 (such as the gap G1) will not be fully filled with the first portion 18A of the first dielectric layer 18, and a recess RC1 may be formed between the adjacent first contact pads PD1 accordingly. Subsequently, as shown in FIG. 3 and FIG. 4, in some embodiments, an etching back process 92 may be performed to the first dielectric layer 18 optionally after the first dielectric layer 18 is formed so as to remove a portion of the first dielectric layer 18 and adjusting the recess RC1. In some embodiments, the thickness of the second portion 18B of the first dielectric layer 18 may be reduced by the etching back process 92, and the second portion 18B of the first dielectric layer 18 may still cover the top surface of each of the second contact pads PD2 after the etching back process 92. In addition, the etching back process 92 may be used to reduce the thickness of the first dielectric layer 18 on each of the first contact pads PD1 and adjust the depth of the recess RC1 in the vertical direction D1, such as reducing a distance between a bottom surface BS1 of the recess RC1 and the substrate 10. For example, the recess RC1 may become the recess RC2 after the etching back process 92, and the distance between the bottom surface BS2 of the recess RC2 and the substrate 10 in the vertical direction D1 may be smaller than the distance between the bottom surface BS1 of the recess RC1 and the substrate 10 in the vertical direction D1.

Subsequently, as shown in FIGS. 3-5, the etching stop layer 20 may be formed after the etching back process 92. The etching stop layer 20 may be formed conformally on the top surface of the first dielectric layer 18, and a portion of the etching stop layer 20 may be formed in the recess RC2. Because of the influences of the recess RC2 of the first dielectric layer 18 and/or the process parameters of forming the etching stop layer 20 (such as film forming rate, process temperature, and so forth, but not limited thereto), the first void V1 may be formed in the etching stop layer 20 when the etching stop layer 20 is formed in the recess RC2, and the recess RC2 is not completely filled with the etching stop layer 20. As shown in FIG. 6, the second dielectric layer 22 may then be formed on the top surface of the etching stop layer 20. The second void V2 may be formed in the second dielectric layer 22 formed in the recess RC2 by controlling process parameters of forming the second dielectric layer 22 (such as film forming rate, process temperature, and so forth, but not limited thereto) because the recess RC2 is not fully filled with the etching stop layer 20.

Additionally, in some embodiments, a void (not illustrated) may be formed in the first dielectric layer 18 located between the adjacent second contact pads PD2 by suitable manufacturing processes for reducing the parasitic capacitance between the adjacent second contact pads PD2. However, generally, it is difficult to form a void directly in the first dielectric layer 18 located between the adjacent first contact pads PD1 because the interval between the adjacent first contact pads PD1 is relatively large. Therefore, the first void V1 and the second void V2 may be formed in the etching stop layer 20 and the second dielectric layer 22, respectively, and located between the adjacent first contact pads PD1 by the manufacturing method described above for reducing the parasitic capacitance between the adjacent first contact pads PD1

In some embodiments, the contact structure 24 described above may be formed after the step of forming the second dielectric layer 22. The etching back process 92 in FIG. 3 may be used to reduce the thickness of the first dielectric layer 18, the etching damage to the first contact pads PD1 and/or other negative influences during the step of forming the opening corresponding to the contact structure 24 may be improved accordingly, and the related manufacturing yield may be therefore enhanced, but not limited thereto.

To summarize the above descriptions, in the contact pad structure and the manufacturing method thereof according to the present invention, the first void and the second void may be disposed in different material layers located between the adjacent first contact pads for reducing the parasitic capacitance between the first contact pads adjacent to each other and improving the interference problem between the contact pads accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A contact pad structure, comprising:
a substrate;
first contact pads disposed on a first region of the substrate;
a first dielectric layer disposed on the substrate and covering the first contact pads, wherein the first dielectric layer comprises a recess located between two of the first contact pads adjacent to each other;
an etching stop layer disposed on the first dielectric layer and partially located in the recess;
a first void disposed in the etching stop layer and located in the recess;
a second dielectric layer disposed on the etching stop layer and partially located in the recess; and
a second void disposed in the second dielectric layer and located in the recess.

2. The contact pad structure according to claim 1, wherein a portion of the first dielectric layer and a portion of the etching stop layer are sandwiched between the first void and one of the two of the first contact pads adjacent to each other in a horizontal direction.

3. The contact pad structure according to claim 1, wherein a portion of the first dielectric layer, a portion of the etching stop layer, and a portion of the second dielectric layer are sandwiched between the second void and one of the two of the first contact pads adjacent to each other in a horizontal direction.

4. The contact pad structure according to claim 1, wherein a material composition of the etching stop layer is different from a material composition of the second dielectric layer.

5. The contact pad structure according to claim 1, wherein each of the first contact pads comprises:
a dielectric pattern; and
an electrically conductive pattern disposed on the dielectric pattern, wherein a bottom surface of the recess is lower than a top surface of the dielectric pattern in a vertical direction.

6. The contact pad structure according to claim 5, wherein the first void is lower than the top surface of the dielectric pattern in each of the first contact pads in the vertical direction.

7. The contact pad structure according to claim 5, wherein the second void is located above the first void in the vertical direction, and the second void is lower than a top surface of the electrically conductive pattern in each of the first contact pads in the vertical direction.

8. The contact pad structure according to claim 5, wherein a material composition of the dielectric pattern is different from a material composition of the substrate.

9. The contact pad structure according to claim 1, wherein the first void and the second void are separated from each other.

10. The contact pad structure according to claim 1, further comprising:
second contact pads disposed on a second region of the substrate, wherein an interval between two of the second contact pads adjacent to each other is less than an interval between two of the first contact pads adjacent to each other, the first dielectric layer further covers the second contact pads, and a space between the second contact pads is fully filled with the first dielectric layer.

11. A manufacturing method of a contact pad structure, comprising:
forming first contact pads on a first region of a substrate;
forming a first dielectric layer on the substrate, wherein the first dielectric layer covers the first contact pads, and the first dielectric layer comprises a recess located between two of the first contact pads adjacent to each other;
forming an etching stop layer on the first dielectric layer, wherein the etching stop layer is partially located in the recess, and a first void is formed in the etching stop layer and located in the recess; and
forming a second dielectric layer on the etching stop layer, wherein the second dielectric layer is partially located in the recess, and a second void is formed in the second dielectric layer and located in the recess.

12. The manufacturing method of the contact pad structure according to claim 11, further comprising:
performing an etching back process to the first dielectric layer after the first dielectric layer is formed and before the etching stop layer is formed so as to remove a portion of the first dielectric layer and reduce a distance between a bottom surface of the recess and the substrate.

13. The manufacturing method of the contact pad structure according to claim 11, further comprising:
forming second contact pads on a second region of the substrate before the first dielectric layer is formed, wherein an interval between two of the second contact pads adjacent to each other is less than an interval between two of the first contact pads adjacent to each other, the first dielectric layer further covers the second contact pads, and a space between the second contact pads is fully filled with the first dielectric layer.

14. The manufacturing method of the contact pad structure according to claim 13, wherein the first contact pads and the second contact pads are concurrently formed by performing a patterning process to a laminated structure formed on the substrate.

15. The manufacturing method of the contact pad structure according to claim 11, wherein a portion of the first dielectric layer and a portion of the etching stop layer are sandwiched between the first void and one of the two of the first contact pads adjacent to each other in a horizontal direction.

16. The manufacturing method of the contact pad structure according to claim 11, wherein a portion of the first dielectric layer, a portion of the etching stop layer, and a portion of the second dielectric layer are sandwiched between the second void and one of the two of the first contact pads adjacent to each other in a horizontal direction.

17. The manufacturing method of the contact pad structure according to claim 11, wherein a material composition of the etching stop layer is different from a material composition of the second dielectric layer.

18. The manufacturing method of the contact pad structure according to claim 11, wherein each of the first contact pads comprises:

a dielectric pattern; and an electrically conductive pattern disposed on the dielectric pattern, wherein a bottom surface of the recess is lower than a top surface of the dielectric pattern in a vertical direction.

19. The manufacturing method of the contact pad structure according to claim 18, wherein the first void is lower than the top surface of the dielectric pattern in each of the first contact pads in the vertical direction.

20. The manufacturing method of the contact pad structure according to claim 18, wherein the second void is located above the first void in the vertical direction, and the second void is lower than a top surface of the electrically conductive pattern in each of the first contact pads in the vertical direction.

* * * * *